United States Patent [19]

Hsu et al.

[11] Patent Number: 5,439,848
[45] Date of Patent: Aug. 8, 1995

[54] METHOD FOR FABRICATING A SELF-ALIGNED MULTI-LEVEL INTERCONNECT

[75] Inventors: Sheng T. Hsu; Robert G. Pollachek, both of Vancouver, Wash.

[73] Assignees: Sharp Microelectronics Technology, Inc., Camas, Wash.; Sharp Kabushiki Kaisha, Osaka, Japan

[21] Appl. No.: 997,730

[22] Filed: Dec. 30, 1992

[51] Int. Cl.⁶ .......................................... H01L 21/768
[52] U.S. Cl. .................................. 437/195; 437/193; 437/51; 437/49
[58] Field of Search ............... 437/193, 195, 203, 192, 437/90, 48, 49, 51, 189, 52

[56] References Cited

U.S. PATENT DOCUMENTS

| | | | |
|---|---|---|---|
| 4,619,037 | 10/1986 | Taguchi et al. | 437/203 |
| 4,663,831 | 5/1987 | Birrittella et al. | 437/195 |
| 4,696,097 | 9/1987 | McLaughlin et al. | 437/193 |
| 4,700,457 | 10/1987 | Matsukawa | 437/52 |
| 4,840,923 | 6/1989 | Flagello et al. | 437/203 |
| 4,849,371 | 7/1989 | Hansen et al. | 437/203 |
| 4,902,641 | 2/1990 | Koury, Jr. | 437/90 |
| 4,977,105 | 12/1990 | Okamoto et al. | 437/189 |
| 4,997,790 | 3/1991 | Woo et al. | 437/195 |
| 5,037,777 | 8/1991 | Mele et al. | 437/195 |
| 5,106,778 | 4/1992 | Hollis et al. | 437/90 |
| 5,234,861 | 8/1993 | Roisen et al. | 437/90 |
| 5,262,352 | 11/1993 | Woo et al. | 437/189 |

FOREIGN PATENT DOCUMENTS 0175604 3/1986 European Pat. Off. .

OTHER PUBLICATIONS

Masato Matsumiya et al. A 15-ns 16-Mb CMOS SRAM with Interdigitated Bit-Line Architecture pp. 1497-1502 Nov. 1992 IEEE Journal of Solid-State Circuits.

K. Itabashi et al. A Split Wordline Cell for 16Mb SRAM Using Polysilicon Sidewall Contacts pp. 477-480 Sep. 1991 IEDM.

C. Lage BiCMOS Memories pp. 31-34 Aug. 1992 Solid State Technology.

T. Ema 3-D Stacked Capacitor Cell pp. 592-595 1988 IEDM.

T. Mele High Performance 0.5 $\mu$m BiCMOS Triple Poly 481-484 1990 IEDM.

*Primary Examiner*—Brian E. Hearn
*Assistant Examiner*—Tuan Nguyen
*Attorney, Agent, or Firm*—Fliesler, Dubb, Meyer & Lovejoy

[57] ABSTRACT

A self-aligned multi-level interconnect structure and a method for fabricating the same are disclosed. The multi-level interconnect structure is fabricated by the steps of: (1) forming a first plurality of spaced-apart insulative layers [231-233], where the first plurality includes a top insulative layer [233]; (2) forming a second plurality of spaced-apart conductors [221,222] and positioning them interdigitally between the insulative layers; (3) defining a first hole [233h] extending through the top insulative layer [233]; (4) using the first hole [233h] to define a succession of self-aligned subsequent holes [222h,232h,22ih,231h] through the underlying conductors and insulative layers, each successive hole being continuous with and self-aligned to one above it; and (5) defining a through-conductor [223] extending through the succession of self-aligned holes. The self-aligned multi-level interconnect structure is employed in a multi-layer SRAM cell.

39 Claims, 9 Drawing Sheets

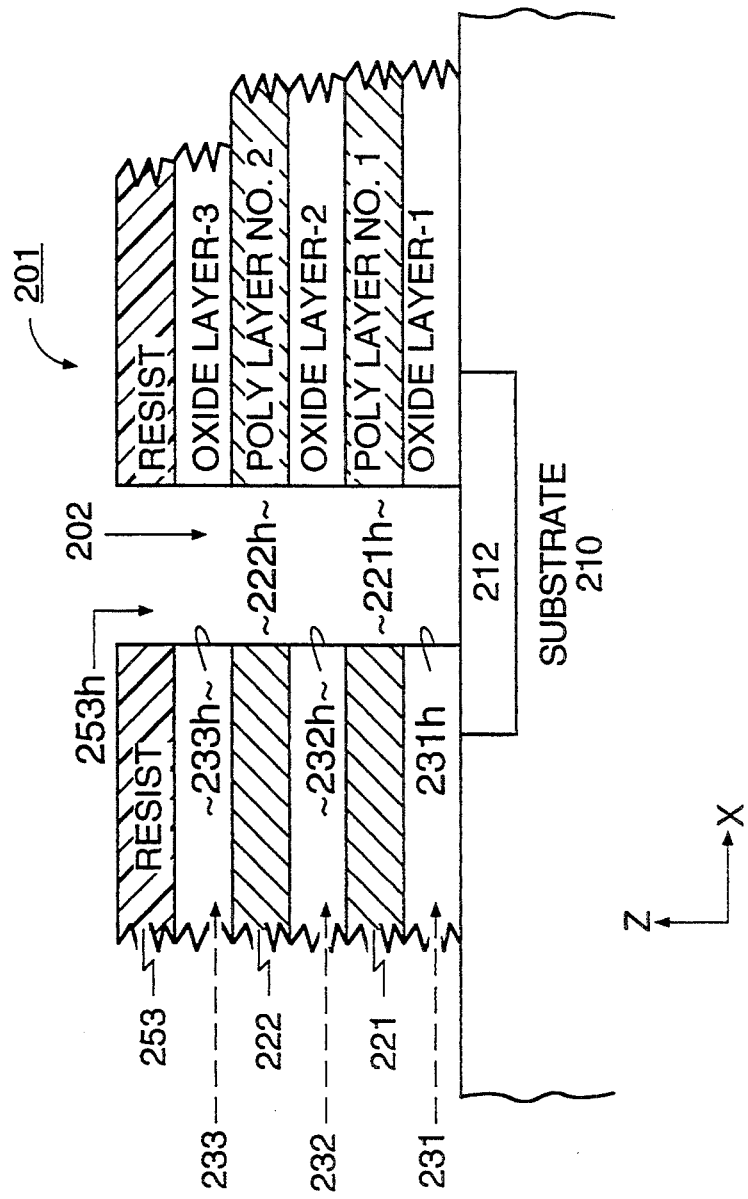

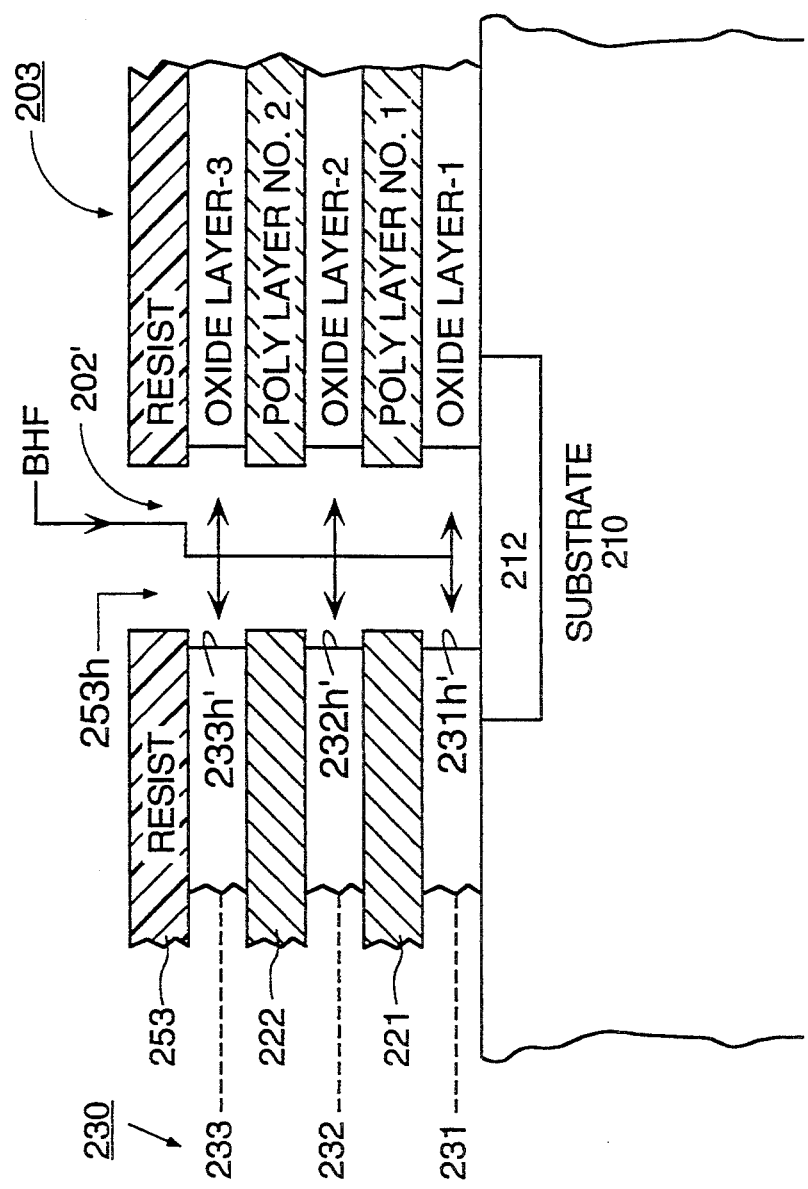

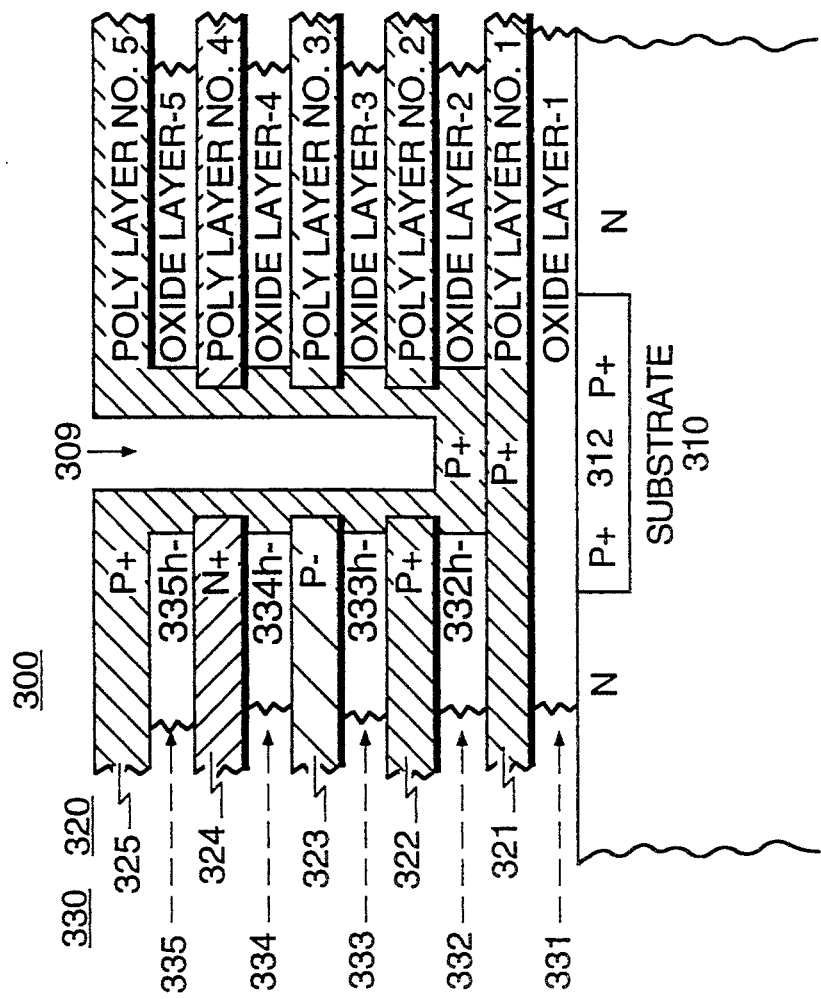

METHOD FOR FABRICATING A SELF-ALIGNED MULTI-LEVEL INTERCONNECT

BACKGROUND

1. Field of the Invention

The invention relates generally to the fabrication of integrated circuits. The invention relates more specifically to a method of forming a self-aligned interconnect structure on an integrated circuit chip where the interconnect structure extends through plural interconnection layers and optionally contacts a substrate contact region.

2. Cross Reference to Related Applications

The following copending U.S. patent applications are assigned to the assignee of the present applications, are related to the present application and their disclosures are incorporated herein by reference:

(A) Ser. No. 07/893,702 [Attorney Docket No. SMTI2004] filed Jun. 5, 1992 by Tatsuo Nakato et al. and entitled SILYLATED PHOTORESIST LAYER AND PLANARIZING METHOD.

(B) Ser. No. 07/922,983 [Attorney Docket No. SMTI2017] filed Jul. 28, 1992 by David A. Vidusek and entitled TRILAYER LITHOGRAPHIC PROCESS AND PRODUCTS THEREOF.

(C) Ser. No. 07/954,505 [Attorney Docket No. SMTI2018] filed Sep. 29, 1992 by David A. Vidusek and Hiroki Tabuchi and entitled LITHOGRAPHIC PROCESS FOR PRODUCING SMALL MASK APERTURES AND PRODUCTS THEREOF.

3. Description of the Related Art

Circuit points in an integrated circuit (IC) chip are often connected one to another by way of conductive lines defined in a plurality of interconnect layers.

In a conventional interconnect process, one or more to-be-contacted regions (such as the sources and/or drains of plural transistors) are first defined in the substrate.

A first oxide or other insulation layer is then formed over the to-be-contacted regions (sources/drains) and also over substrate regions that are not to-be contacted (e.g., channel regions of field effect transistors (FET's)).

Subsequently, a first photolithographic step is used to project a first "through-holes" pattern onto a temporary photoresist coating that is placed on the first oxide layer. The first pattern is developed to create a corresponding set of one or more vertical through-holes each extending through the first oxide layer to one of the to-be-contacted substrate regions (e.g., transistor sources/drains).

Then a first metal or other interconnect material (e.g. heavily doped polysilicon) is deposited onto the first oxide layer such that the deposited interconnect material (e.g., Metal-1 or Poly-1) defines a first interconnect layer, fills the through-holes in the process, and makes contact with the to-be-contacted substrate regions. The interconnect material that fills each vertical through-hole is referred to as an interconnect via.

Subsequently, a second photolithographic step is used to project a first "conductive-lines" pattern onto a temporary photoresist coating that is placed on the first interconnect layer (Metal-1 or Poly-1). The conductive-lines pattern is developed to create a corresponding set of one or more laterally extending conductive lines in the first interconnect layer (Metal-1 or Poly-1).

Next, a second oxide or other insulation layer is formed over the patterned first interconnect layer (e.g. Metal-1 or Poly-1) and a third photolithographic step is used to define and etch a second set of through-holes extending through the second oxide layer to the patterned first interconnect layer (e.g. to Metal-1 or Poly-1). This is followed by deposit and patterning of a second interconnect layer (e.g. Metal-2 or Poly-2), formation and etch-through of a third oxide layer, and so forth, until all interconnects have been made from one patterned interconnect layer to the next and to the to-be-contacted substrate region.

This conventional interconnect method suffers from several problems:

Problem (1): When an interconnection is to be made through multiple layers, it is often desirable to stack the patterned interconnect lines and corresponding vertical interconnect vias one directly above another so that overall consumption of lateral area over the chip surface will be minimized. Some leeway needs to be provided, however, for possible misalignment between the conductive-line patterns of successive interconnect layers and the through-hole patterns of successive oxide layers. This leads to design rules where interconnect vias are forced to have wider-than necessary diameters to assure that they will overlap with conductive lines above and below them even when worst case misalignment occurs. Spacings between laterally adjacent interconnect lines have to be enlarged in the region of the interconnect vias in order to avoid undesired shorts. Interconnect vias of multi-layer structures are conventionally staggered relative to one another in the lateral direction to avoid such problems and to assure that good contact is made between each vertical via and its respective top and bottom, laterally-extending conductor lines. As a consequence, the interconnect structures of IC chips are disadvantageously limited to having smaller densities (fewer vertical vias and/or conductive-lines per lateral square centimeter) than would otherwise be possible. The problem grows as more interconnect layers are added to a design because the worst case misalignment between plural interconnect layers is proportional to the number of layers.

Problem (2): Another problem of the conventional interconnect-forming approach is that multiple photolithographic steps are used to define a vertical series of through-holes. Each additional photolithographic step consumes more production time and increases the chance of process related defects. Production time and defect rates increase disadvantageously as more interconnect layers are added to a design.

Problem (3): Another shortcoming of the conventional interconnect-forming approach is that interconnect vias of that approach are limited to function only as high-conductivity elements.

There is a long felt and continuously increasing demand in the IC fabrication field for increasing the density at which interconnect and other functions are placed in each available two-dimensional lateral and/or three-dimensional space of an integrated circuit chip. Conventional integrated circuits have only two or three interconnect layers. One of the solutions proposed for increasing interconnect density and complexity is to provide four, five or even more interconnect layers on an IC chip. Unfortunately this is commercially impractical because of the above mentioned problems.

SUMMARY OF THE INVENTION

The invention overcomes the above-mentioned problems by providing a method for fabricating a self-aligned multi-level interconnect structure.

A self-aligned multi-level interconnect structure in accordance with the invention comprises: (1) a first plurality of spaced-apart insulative layers [231-233], where the first plurality includes a top insulative layer [233]; (2) a second plurality of spaced-apart conductors [221,222], interdigitally positioned between the insulative layers; where a first hole [233h] is defined extending through the top insulative layer [233]; where a succession of self-aligned subsequent holes [222h,232h,221h,231h] are defined through the underlying conductors and insulative layers, each successive hole being continuous with and self-aligned to one above it, the uppermost [222h] of the subsequent holes being self-aligned to the first hole [233h]; and (3) a through-conductor [223] extending through the first hole [233h] and one or more of the succession of self-aligned holes [222h,232h,221h,231h].

A method in accordance with the invention comprises the steps of: (1) forming a first plurality of spaced-apart insulative layers [231-233], where the first plurality includes a top insulative layer [233]; (2) forming a second plurality of spaced-apart conductors [221,222] and positioning them interdigitally between the insulative layers; (3) defining a first hole [233h] extending through the top insulative layer [233]; (4) using the first hole [233h] to define a succession of self-aligned subsequent holes [222h,232h,221h,231h] through the underlying conductors and insulative layers, each successive hole being continuous with and self-aligned to one above it; and (5) defining a through-conductor [223] extending through the succession of self-aligned holes.

The subject matter of the above-cited copending applications: (A) Ser. No. 07/893,702 which is entitled, SILYLATED PHOTORESIST LAYER AND PLANARIZING METHOD; (B) Ser. No. 07/922,983 which is entitled, IMPROVED TRILAYER LITHOGRAPHIC PROCESS AND PRODUCTS THEREOF; and (C) Ser. No. 07/954,505 [Attorney Docket No. SMTI2018] which is entitled, LITHOGRAPHIC PROCESS FOR PRODUCING SMALL MASK APERTURES AND PRODUCTS THEREOF; may be used in conjunction with the present invention to provide improved aperture size and/or planarity.

BRIEF DESCRIPTION OF THE DRAWINGS

The below detailed description makes reference to the accompanying drawings, in which:

FIG. 2B is a cross sectional side view showing a second fabrication step.

FIG. 2C is a cross sectional side view showing an optional third fabrication step.

FIG. 3B is a cross sectional side view showing another interconnect structure in accordance with the invention.

DETAILED DESCRIPTION

Figure 1A:
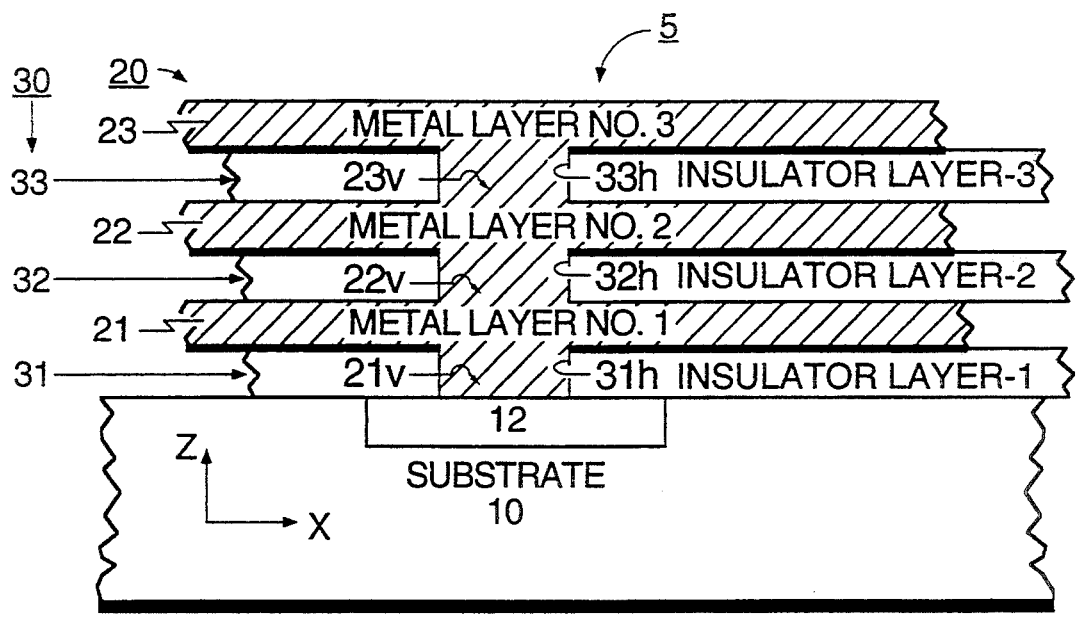
FIG. 1A is a cross sectional side view showing an ideal first multi-layer interconnect structure.

FIG. 1A is a partial, cross-sectional side view showing an "ideal" multi-layer interconnect structure 20. This "ideal" structure is illustrated merely for the purpose of developing a series of concepts that continue in FIG. 1C and culminate in FIGS. 3A through 4B. Jagged ends of each layer in FIG. 1A indicate that the layer continues to the left or right.

The term "ideal" is used in conjunction with the multi-layer interconnect structure 20 of FIG. 1A to define a condition where vertical interconnect vias such as those shown at 21v, 22v and 23v align perfectly with one another along the vertical axis Z and where they also align perfectly in the X or Y direction with the center of the widths (See FIG. 1B top view which shows the X and Y axes) of relatively narrow conductive-lines 21, 22 and 23, the latter being lines that extend through the interconnect structure 20 in the lateral (X or Y) direction.

Ideal multi-layer interconnect structure 20 is provided as part of an integrated circuit device 5 which includes a supporting semiconductor or other substrate 10 and an electrical insulation structure 30. The multi-layer interconnect structure 20 makes contact with a contact region 12 of the substrate 10 and provides a low resistance connection between the contact region 12 and extreme ends (not shown) of conductive-lines 21, 22 and 23. It is understood that conductive-lines 21, 22 and 23 extend beyond FIG. 1A to make connections at their extreme ends (not shown) with other parts of the integrated circuit device 5. It is also understood that the substrate 10 of integrated circuit device 5 includes a plurality of circuit components (not shown) such as transistors, resistors, capacitors, field-oxide isolators and/or diodes.

As seen in FIG. 1A, the multi-layer interconnect structure 20 includes a first vertical via 21v making contact with contact region 12. A first insulator layer 31 lies on top of substrate 10. The first insulator layer 31 surrounds first vertical via 21v and supports an overlying first metal layer (Metal-1). Conductive-line 21 defines part of the first metal layer (Metal-1). First vertical via 21v extends continuously from conductive-line 21, passing through an aperture or through-hole 31h that has been defined through first insulator layer 31.

Similarly, interconnect structure 20 further includes a second vertical via 22v which perfectly overlaps first vertical via 21v along the Z direction and makes contact with an underlying top portion of conductive-line 21. A second insulator layer 32 lies on top of the first metal layer (Metal-1). The second insulator layer 32 surrounds second vertical via 22v and supports an overlying second metal layer (Metal-2). Conductive-line 22 defines part of the second metal layer (Metal-2). Second vertical via 22ν extends continuously from conductive-line 22, passing through an aperture or through-hole 32h that has been defined through second insulator layer 32.

The same organization follows for third vertical via 23ν, third insulator layer 33 and the illustrated third metal layer (Metal-3), where the latter includes third conductive-line 23 and the former includes third through-hole 33h.

Figure 1B:
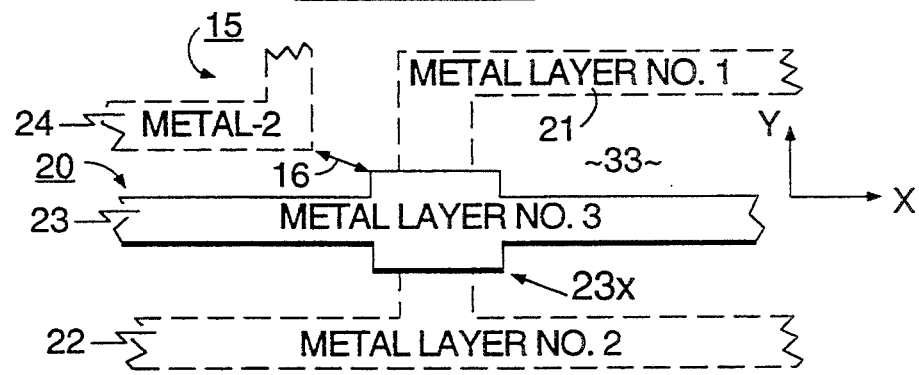
FIG. 1B is a top plan view of a multi-layer interconnect structure such as the one shown in FIG. 1A.

FIG. 1B is a top plan view showing one possible pattern 15 for conductive-lines 21, 22 and 23. It is to be understood that many other patterns are possible. First through third vertical vias 21ν-23ν lie under the box shaped center 23x of third conductive-line 23. Conductive-lines 21 and 22 are drawn with dashed (hidden) lines to indicate they lie below third insulator layer 33.

Note that FIG. 1B shows a fourth conductive line 24 positioned within the second metal layer (Metal-2) and under third insulator layer 33. The fourth conductive line 24 passes as close as distance 16 to the vertical via region 23x. This fourth conductive line 24 is supposed to remain electrically separated from interconnect structure 20.

Interconnect vias 21ν, 22ν and 23ν align perfectly with one another along the vertical axis Z under via region 23x as a result of the "ideal" condition of multi-layer interconnect structure 20. The importance of either maintaining or approaching this ideal condition is best appreciated from the top view perspective of FIG. 1B. If fabrication misalignment were to occur, and the position of either one of interconnect vias 22ν or 23ν were to slide over along distance 16 to overlap the position of the fourth conductive line 24, an undesirable short will develop between multi-layer interconnect structure 20 and line 24. Conventional design rules require distance 16 to be sufficiently large to avoid such shorts even under worst-case expected amounts of misalignment.

Figure 1C:
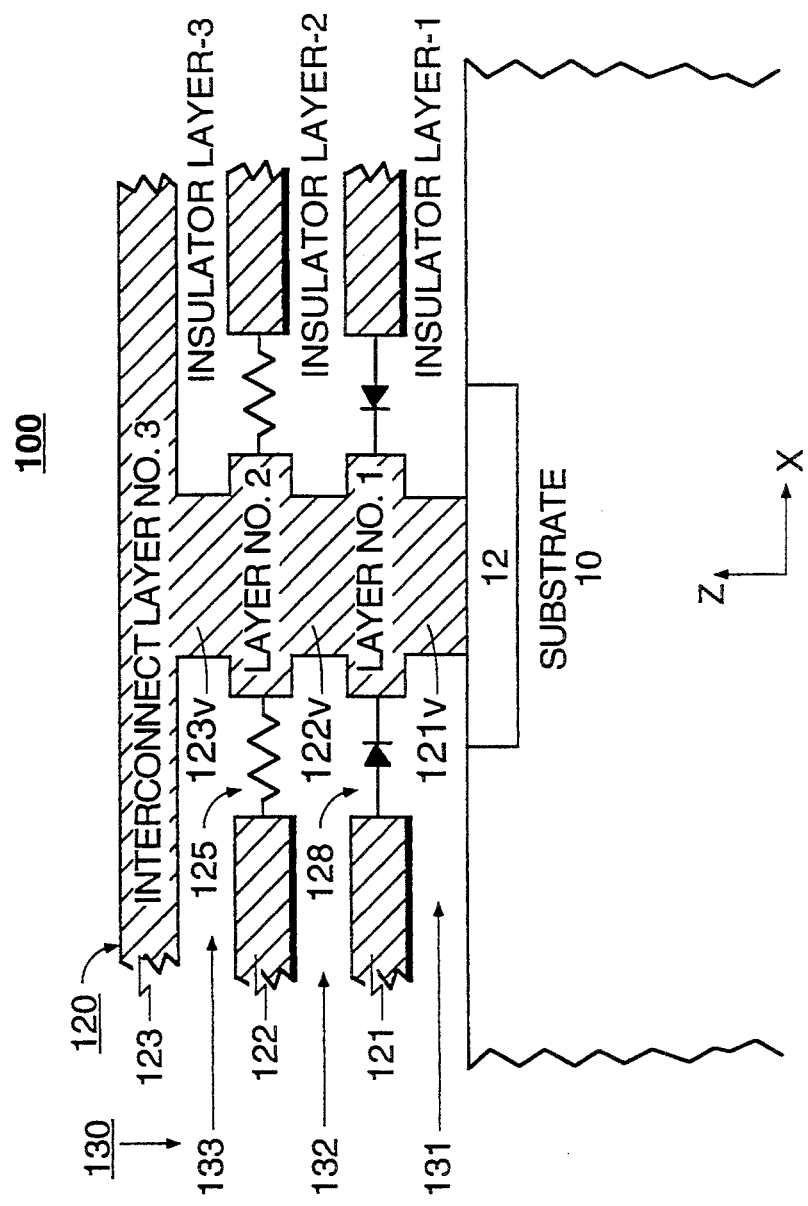
FIG. 1C is a combination schematic diagram and cross sectional side view showing a second multi-layer interconnect structure which includes integrated circuit functions such as resistive interconnect and PN junction interconnect/isolation.

Referring to FIG. 1C, a variation on the theme of FIG. 1A is shown. Like reference symbols in the 100 number series are used for elements of FIG. 1C which correspond to but are not necessarily the same a those of FIG. 1A.

FIG. 1C is drawn as a combination schematic diagram and cross sectional side view showing a second integrated circuit device 100 having a second multi-layer interconnect structure 120 which includes integrated circuit functions such as resistive interconnect elements 125 and PN junction interconnect/isolation elements 128 (represented as diodes).

The illustrated second multi-layer interconnect structure 120 occupies substantially no more space than does the corresponding first multi-layer interconnect structure 20 of FIG. 1A even though the former multi-layer interconnect structure 120 integrally incorporates the already-mentioned resistive interconnect functions 125 and PN junction interconnect/isolation functions and the latter does not.

The materials of conductive-lines 121, 122 and 123 are not necessarily metal. They can be other conductive materials such as conductive semiconductor materials (e.g., lightly or heavily doped polycrystalline silicon).

Third conductive-line 123 provides a low resistance interconnect path from contact region 12 to other parts of the integrated circuit device 100 by way of vertically aligned vias 121ν, 122ν and 123ν.

The connection between second conductive-line 122 and contact region 12 includes a resistive function (in a distributed form and/or in the form of a discrete resistive element) 125 having a desired resistance value. The connection between first conductive-line 121 and contact region 12 includes a PN junction function (or element) 128 which provides one or both of a forward-biased PN junction voltage drop or reverse-biased PN junction isolation between contact region 12 and the extreme end of first conductive-line 121, depending on the voltages that develop at those points.

The advantage of the second multi-layer interconnect structure 120 shown in FIG. 1C is higher functional density. Rather than merely providing low resistance paths between contact region 12 and other parts of integrated circuit device 100 as did the first multi-layer interconnect structure 20, the second interconnect structure 120 also provides a variety of other desirable functions within substantially the same space. (It is to be understood that sufficient space is preferably provided for supporting the depletion zone of PN junction 128 when it is reverse biased and/or sufficient space is provided for setting the resistance of resistive element 125 to a desired value.) The interconnect vias of the second multi-layer interconnect structure 120 are aligned to one another along the vertical axis Z.

Figure 2A:
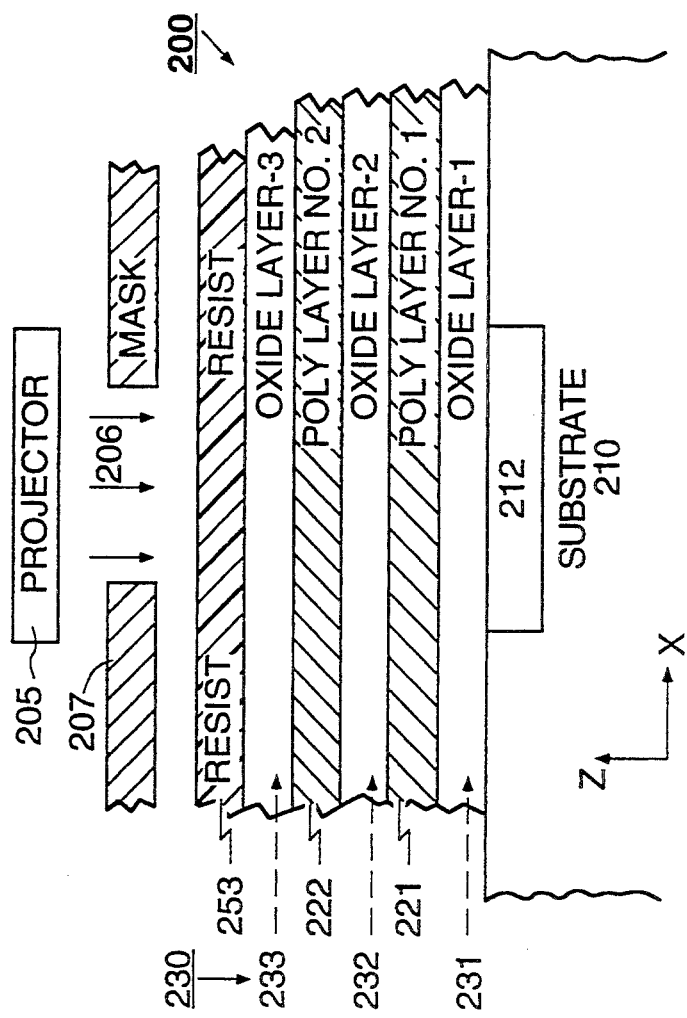
FIG. 2A is a cross sectional side view showing a first step in the fabrication of multi-layer interconnect structure according to the invention.

Referring to FIG. 2A, a fabrication method for realizing the various aspects of FIGS. 1A and 1C, including the alignment of vertical vias and the provision of circuit functions other than just low resistance interconnect, will now be described.

Like reference symbols in the 200 number series are used for elements of FIG. 2A which correspond to but are not necessarily the same a those of FIGS. 1A through 1C.

A partially-fabricated integrated circuit device 200 as shown in FIG. 2A may be created by the following steps or their equivalents:

(1) providing a semiconductor (e.g., monocrystalline silicon) or other integrated circuit substrate 210;

(2) defining regions of various P, N or other conductivities in substrate 210, including a contact region 212 at a top surface of substrate 210;

(3) forming a first (preferably thin) oxide or other insulation layer 231 on substrate 210 by way of thermal growth, chemical vapor deposition (CVD) or other suitable means;

(4) forming a first conductive polycrystalline silicon or other interconnect layer 221 on first insulator layer 231 by way of chemical vapor deposition (CVD) or other suitable means;

(5) patterning the first interconnect layer 221 to define conductive lines therein with desired shapes by way of photo-chemical etching or other suitable means;

(6) repeating steps 3 through 5, one or more times to thereby define a second insulator layer 232 (composed of silicon dioxide or another suitable insulator) on first conductive-layer 221, and to define a patterned second conductive interconnect-layer 222 (composed of conductive polycrystalline silicon or another suitable material) on top of the second insulator layer 232, and to define a third insulator layer 233 (composed of silicon dioxide or another suitable insulator) on top of the second conductive-layer 222, and if desired, to continue with additional pairs (not shown) of a patterned interconnect layer followed by an overlying insulator layer; and (7) after the uppermost conductive or insulating layer (e.g., third insulator layer 233) has been formed, depositing a photoresist layer 253 on top of the uppermost layer (e.g., 233).

The partially-fabricated integrated circuit device 200 is next placed in a photolithographic imaging/development unit for patterning photoresist layer 253. Those skilled in the art will recognize that either a positive development or negative development process may be used.

FIG. 2A shows the positive development version. Portions of photoresist layer 253 that lie over but within the X and Y bounds of contact region 212 and are exposed to light rays 206, provided from projector 205 through mask 207. The exposed portions are etched away while unlit portions of photoresist layer 253 remain. The photolithographic imaging/development process is specific to the material of photoresist layer 253.

Insulator (e.g. oxide) layers 233, 232 and 231 remain as they were before the photoresist layer 253 is patterned. Interconnect (e.g., poly) layers 222 and 221 also remain as they were before the photoresist layer 253 is patterned.

After imaging and development, the material and thickness of photoresist layer 253 should be such that it is capable of acting as an etch stop for a series of next-described anisotropic plasma etching steps. Different plasma etch machines produce different rates of erosion for the photoresist. Photoresist thickness should be adjusted to withstand the combined series of the next-described anisotropic plasma etching steps. Examples of suitable negative development photoresists include the AZ5200 TM series in negative tone. Examples of suitable positive development photoresists include AZ-1350J TM or Shipley Microposit 1400 TM or Hunt 6500 TM.

Referring to FIG. 2B, the aperture 253$h$ that is defined through photoresist layer 253 as a result of the above described photolithographic imaging/development process (FIG. 2A) is now used as a reference etch stop for self-alignably defining through-hole 233$h$ through third insulator layer 233. A plasma etch specific to the material of third insulator layer 233 is used. In the case where layer 233 is an oxide of silicon (e.g., SiO$_2$, Si$_x$O N$_z$, etc.) oxide-specific etchants such as CF$_4$, C$_2$F$_6$, CHF$_3$ and SF$_6$ may be used.

The combination of the reference aperture 253$h$ defined through photoresist layer 253 and the aperture 233$h$ defined through third insulator layer 233 as a result of the above described etch-through processes is now used as an etch stop for defining through-hole 222$h$ through second conductive-layer 222. A plasma etch specific to the material of second conductive-layer 222 is used. In the case where layer 222 is silicon (monocrystalline or polycrystalline), silicon-specific etchants such as Cl$_2$ and CFCl$_3$ may be used.

The apertures 253$h$ and 222$h$ respectively defined through photoresist layer 253 and second conductive-layer 222 as a result of the above described etch-through processes are next used as etch stops for defining through-hole 232$h$ through second insulator layer 232. A plasma etch specific to the material of second insulator layer 232 is used. This etchant might at the same time widen the through-hole 233$h$ already defined through third insulator layer 233. It will be seen shortly that this is a beneficial side effect.

The apertures 253$h$, 233$h$ and 232$h$ respectively defined through photoresist layer 253 and third insulator layer 233 and second insulator layer 232 as a result of the above described etch-through processes are next used as etch stops for defining through-hole 221$h$ through first conductive-layer 221. A plasma etch specific to the material of first conductive-layer 221 is used.

Finally, the apertures 253$h$, 222$h$ and 221$h$ respectively defined through photoresist layer 253 and second conductive-layer 222 and first conductive-layer 221 as a result of the above described etch-through processes are next used as etch stops for defining through-hole 231$h$ through first insulator layer 231. A plasma etch specific to the material of second insulator layer 232 is used.

The result of the above etch-through steps is the partially-fabricated integrated circuit device 201 shown in FIG. 2B. Of importance, it is to be noted that the depth of the layer-selective, hole generating process is easily controlled. The hole generating process could have been precisely stopped at the top surface of any desired layer below upper layer 233 but above substrate 210 simply by not employing the subsequent, layer-selective etch steps. Hole generation down to the surface of substrate 210 is shown as merely one example of a method in accordance with the invention.

It is to be noted that alternating layers of etch-differentiated materials other than silicon (selectively etched by Cl$_2$ but resists etching by CF$_4$) and silicon oxide (selectively etched by CF$_4$ but resists etching by Cl$_2$) can be used. Examples of other etch-differentiated materials include silicon nitride for the insulator layers and various IC-compatible metals such as aluminum, copper, tungsten, titanium or cobalt for the conductor layers.

The intermediate product 201 shown in FIG. 2B now includes a vertical passageway 202 defined in it, extending from resist through-hole 253$h$ to a desired lower layer, e.g., the surface of substrate contact region 212. Passageway 202 is defined by the successive sequence of self-aligned apertures 233$h$, 222$h$, 232$h$, 221$h$ and 231$h$ defined through respective layers 233, 222, 232, 221 and 231. Note that the passageway 202 is bored vertically so that aperture 231$h$ is positioned well within the boundaries of contact region 212 and so that passageway 202 exposes only the desired surface of contact region 212 and not undesired other surface parts of substrate 210.

FIG. 2C shows an optional oxide-aperture widening step. An isotropic etchant such as BHF (Buffered Hydro-Flouric acid) which is specific to the materials of first through third insulator layers 231–233, is applied to widen apertures 231$h$, 232$h$ and 233$h$ while leaving the widths of interconnect apertures 221$h$ and 222$h$ substantially intact. This has the effect of increasing the exposed surface areas of interconnect layers 221 and 222 within passageway 202' and also the exposed surface area of contact region 212. This surface-area enhanced version of FIG. 2C is referred to as partially-fabricated integrated circuit device 203.

As an alternative to, or as an additional step to the isotropic etch away of the oxide sidewalls, selective growth of the silicon sidewalls may be used to increase the exposed surface area within passageway 202' of silicon areas 212, 221 and 222. Unlike uniform deposition which coats both oxide and silicon with new silicon, selectively grown silicon preferentially adheres to the exposed silicon regions (212, 221 and 222). With appropriate, empirically-determined setting of growth temperature and vapor chemistry, the growth can be made to form nodular bumps (growth islands) of silicon on the growth surface. See Y. Furumura, Journal of the Electrochemical Society, Vol. 133, No. 2, page 379, 1986. Nodular bumps tend to grow in a temperature range of approximately 900° C. to 1000° C. in an SiHCl$_3$—H$_2$ gas atmosphere at a pressure of approximately 100 PA. The growth of nodular bumps advantageously increases contact surface area for a below described strapping step. The grown silicon bumps are preferably doped heavily in situ or by diffusion as P+ or N+ to further improve contact with the below described strapping layer 223 (FIG. 3A).

As an alternative to, or as an additional step to the isotropic etch away of the oxide sidewalls, and/or the selective growth of the silicon sidewalls with or without nodular bumps, the contact surface area of the exposed silicon layers 212, 221 and 222 can be further enhanced by use of a "micro villus" patterning process such as described by J. H. Ahn, in 1992 IEEE VLSI Symposium, "Micro Villus Patterning (MVP) Technology for 250 Mb DRAM Stacked Cell", paper 2—2. A thin oxide layer is grown on the surface of the silicon whose surface area is to be increased. (In our case it is the sidewall surfaces of the conductive layers that are to be strapped together by the strapping layer.) Next, a discontinuous layer of polysilicon pellets is deposited on the thin oxide. This produces a surface composed of the thin oxide with a distribution of small, spaced-apart polysilicon islands on top of it. (It is referred to as an HSG archipelago structure). An oxide-specific etchant is used to remove parts of the thin oxide not covered by the polysilicon islands. A silicon-specific etchant is thereafter used to remove parts of the silicon surface not covered by the thin oxide. (The etchant also removes the polysilicon islands. The underlying spots of thin oxide act as etch stops.) The thin oxide spots are then cleaned away with an isotropic etchant such as BHF (Buffered Hydro-Flouric acid) which is specific to the material of the oxide spots. Removal of the silicon material which was not protected by the oxide spots leaves behind pits in the silicon surface and this increases the effective surface area.

Figure 3A:
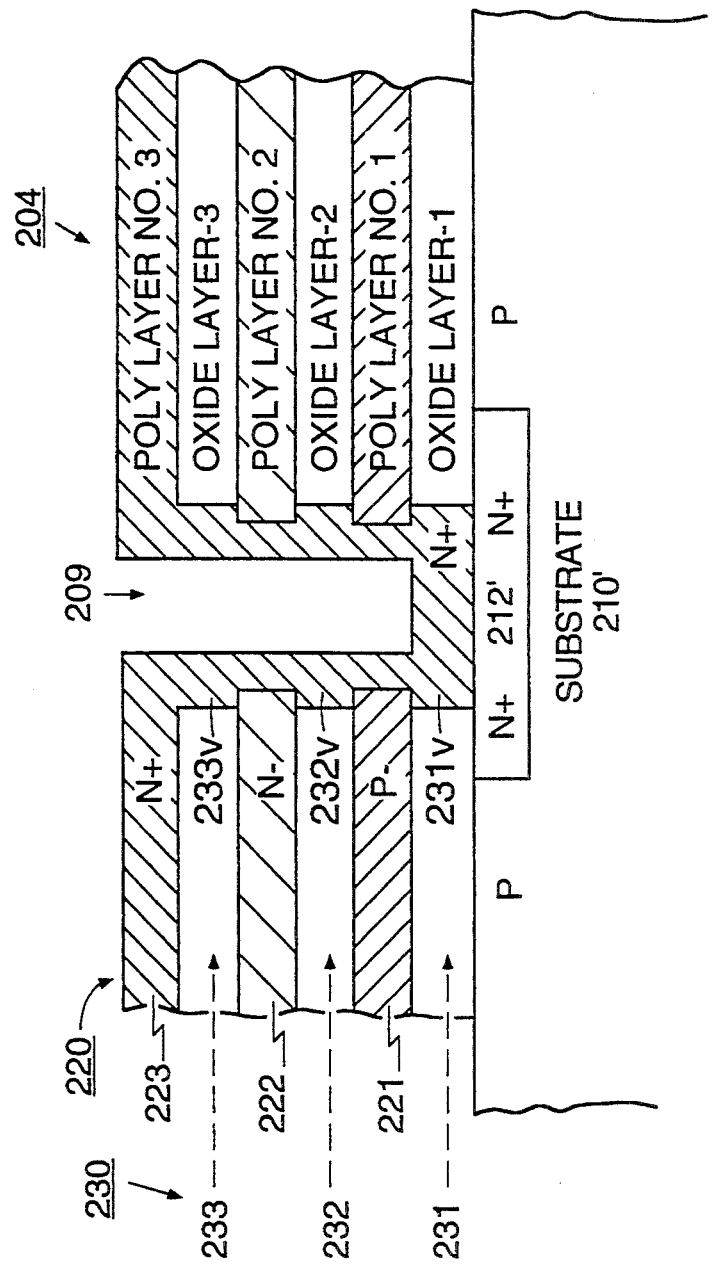
FIG. 3A is a cross sectional side view showing an interconnect structure in accordance with the invention.

The above, optional, surface-area enhancing step or steps are followed by the resist strip and uniform deposition steps of next-described FIG. 3A.

Referring to FIG. 3A, the photoresist layer 253 is stripped away from the top of partially-fabricated integrated circuit device 201 (FIG. 2B) or 203 (FIG. 2C) using a suitable organic solvent or an O$_2$ plasma ash process. A third conductive-layer 223 is thereafter deposited on the device (by CVD or other suitable means) to coat its top surface and to further make continuous contact through passageway 202 (FIG. 2B) or 202' (FIG. 2C) with exposed portions of first and second conductive-layers 221 and 222 and also with the exposed surface of contact region 212.

The third conductive-layer 223, which is also referred to as the stack-strapping layer, can be made of any suitable conductive material including but not limited to metals such as aluminum or copper, refractory metals such as Ti, W, Co and N+ or P+ polysilicon or other conductive materials.

After deposition (or growth), the conductive strapping-layer 223 is patterned to form conductive lines therein of desired shapes including one whose cross section is shown in FIG. 3A. (The stack-strapping conductor 223, which extends through the succession of through-holes 202,202', is also referred to below as a "through-conductor" because it extends through the succession of through-holes 202, 202'.)

A trench 209 may result from this coating step depending on the width of the original passageway 202 or 202' and the thickness of coating layer 223. This trench 209 can be filled with a suitable material such as SOG (spin on glass) to planarize the resulting integrated circuit device 204, if desired.

FIG. 3A shows that specific conductivities have been given to portions of resulting integrated circuit device 204 during or immediately after their respective formations or depositions, as follows.

The bulk of substrate 210' is moderately doped to be a P type semiconductor. Contact region 212' is heavily doped to be a N+ region.

Third conductive-layer 223 (the through-conductor) is heavily doped N+ polycrystalline silicon and therefore makes ohmic contact with N+ contact region 212'. The third conductive-layer 223 also provides a low-resistance interconnect path from contact region 212' to extreme ends (not shown) of the patterned conductive line that forms the cross section shown as 223 in FIG. 3A.

Second conductive-layer 222 is lightly doped N-polycrystalline silicon and therefore makes ohmic contact with the N+ conductive line of third conductive-layer 223. The relatively light doping of second conductive-layer 222 causes its patterned conductive lines to behave as resistive elements. The actual resistance of these elements depends on well known factors such as the concentration of doping and the width, length and thickness of the conductive line.

First conductive-layer 221 is lightly doped P-polycrystalline silicon and therefore makes a PN junction type of contact with the N+ conductive line of third conductive-layer 223. The relatively light doping of second conductive-layer 222 causes its patterned conductive lines to behave as resistive elements. If the PN junction formed at the juncture of interconnect lines 221 and 223 is reverse biased, line 221 will be isolated from contact region 212 because of the reverse biased junction. If the PN junction formed at the juncture of interconnect lines 221 and 223 is forward biased, line 221 will be electrically coupled to contact region 212 by way of the forward biased junction.

It is to be understood that a variety of combinations are possible, depending on the choice of conductivity types, materials and patterning for the various layers of FIG. 3A.

Although FIG. 3A shows but three conductive polysilicon layers and three oxide layers, it is to be understood that many more layers could have been used without substantially increasing the lateral space occupied by the multi-layer contact. The layer (e.g., 233) just below the uppermost resist layer 253 of the pre-strapped embodiment shown in FIG. 2C need not be an insulator. It can instead be a conductive layer (e.g., P- or N-polysilicon) onto which a conductive strapping layer (e.g., metal) is next added. Hole 202' (FIG. 2C) need not extend completely down to the substrate 210. Its depth can be stopped at any desired layer above the substrate surface.

Referring to FIG. 3B, another integrated circuit device 300 in accordance with the invention is shown. Device 300 has five conductive layers 321-325 each preferably composed of lightly or heavily doped, P-type or N-type polycrystalline silicon. Device 300 further includes five insulative layers 331-335 respectively interposed below a corresponding one of interconnect layers 321–325. Each of insulative layers 331–335 is preferably composed of a silicon oxide or a silicon nitride.

Like reference symbols in the 300 number series are used for elements of FIG. 3B which correspond to but are not necessarily the same a those of FIGS. 2A through 3A. Note that in the case of FIG. 3B, the self-aligned passageway from oxide layer 335 down stops with the aperture 332h cut through second insulator layer 332. Conductive line 325 does not make contact with region 312 of substrate 310. This result is obtained simply by not etching through first conductive-layer 321 when the passageway is formed.

The self-aligned interconnect structure of the invention can be advantageously used in numerous types of integrated circuits where dense interconnect and dense function performance are required.

Figure 4A:
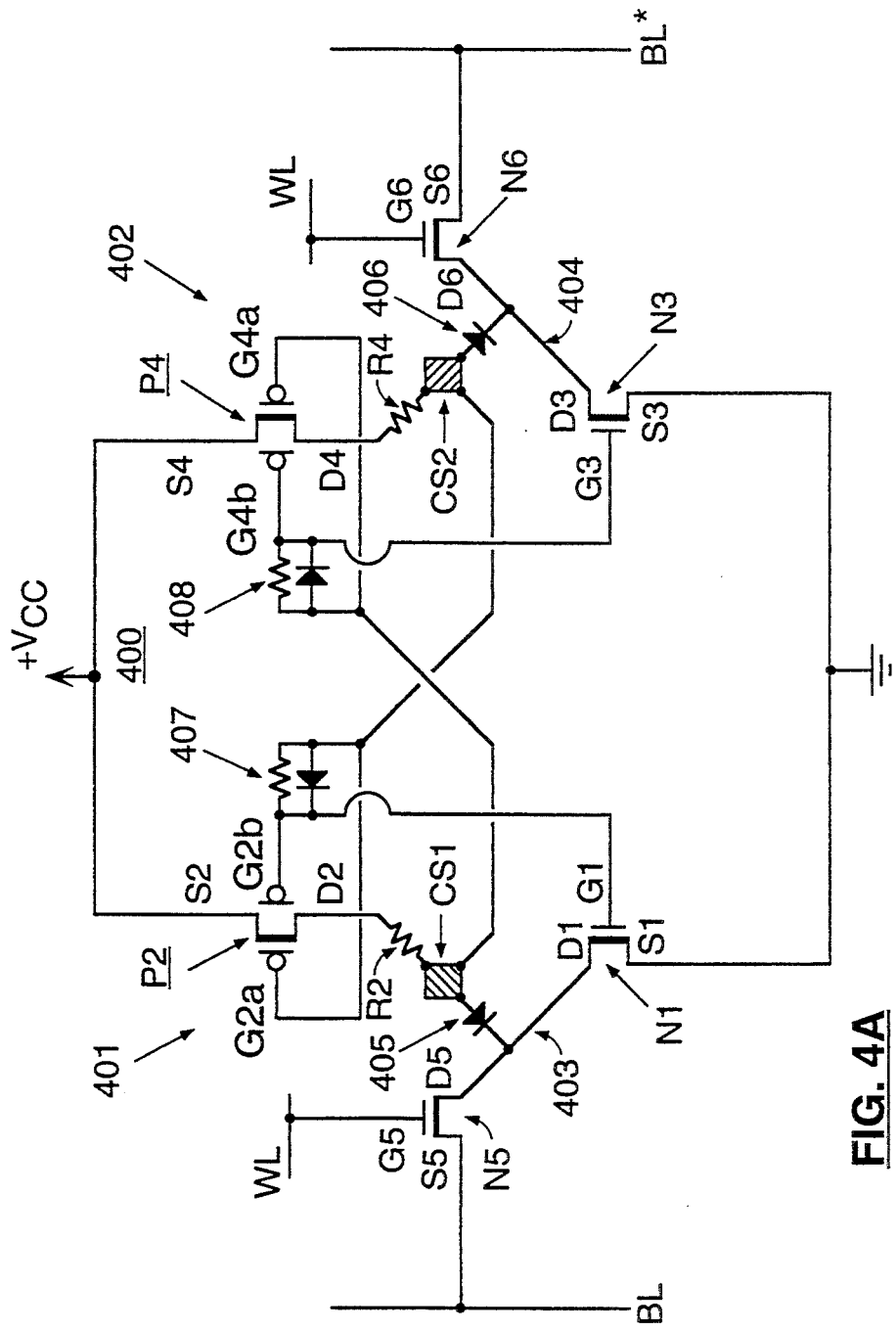
FIG. 4A is a schematic diagram of a six transistor SRAM cell whose cross section is shown in FIG. 4B.
Figure 4B:
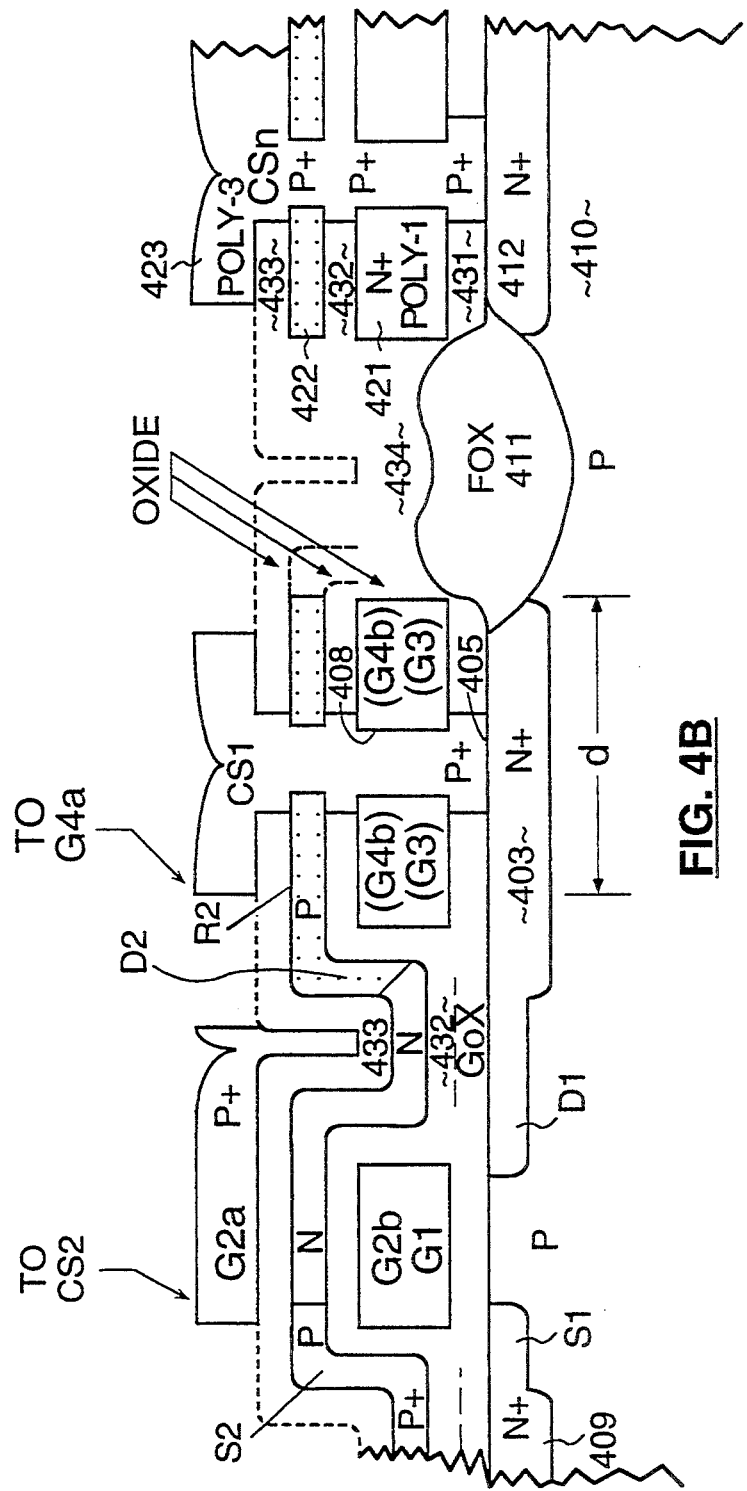
FIG. 4B is a cross sectional side view showing a first contact structure CS1 of a multi-layer SRAM cell structure in accordance with the invention.

FIGS. 4A and 4B illustrate one example. FIG. 4A shows a schematic of a six-transistor SRAM cell (Static Random Access Memory cell) 400. Four of the six transistors are defined in the substrate and two of the transistors (P2 and P4) are defined as Thin-Film Transistors (TFT) in doped polycrystalline layers spaced above the substrate. The cross section of one of these TFT's (P2) is shown in FIG. 4B.

Referring to FIG. 4A, field effect transistors N1 and P2 define part of a first inverter 401. Field effect transistors N3 and P4 define part of a second inverter 402. An "N" prefix indicates an N-channel FET (field effect transistor) here. A "P" prefix indicates a P-channel FET The prefixes "S", "G" and "D" are used here to respectively denote source, gate and drain electrodes Numbers following prefixes "S", "G" and "D" indicate the corresponding one of transistors N1, P2, N3, P4, N5 and N6 to which the named electrode belongs.

The respective inputs and outputs of inverters 401 and 402 are cross-coupled to define the SRAM cell circuit 400.

Pass transistor N5 couples the output of inverter 401 to bit line BL. Pass transistor N6 couples the output of inverter 402 to complementary bit line BL*. Although not fully shown, word line WL connects both to gate G5 of pass transistor N5 and to gate G6 of pass transistor N6. When word line WL is raised to a logic-high voltage, a conductive path is created between source-/drain electrodes S5 and D5 of pass transistor N5 and another conductive path is created between source-/drain electrodes S6 and D6 of pass transistor N6 thereby coupling bit line BL to first inverter 401 and complementary bit line BL* to second inverter 402.

A first contact structure CS1 is provided within first inverter 401 for coupling drain D1 of sink transistor N1 to drain D2 of load transistor P2 and for further coupling drain electrodes D1 and D2 to gate electrodes G3, G4a and G4b of second inverter 402. First contact structure CS1 is a self-aligned multi-level interconnect structure in accordance with the invention. A side cross sectional view of this first contact structure CS1 is seen in FIG. 4B.

Due to the conductivity types (P or N) and doping concentrations of the multiple conductive layers (412, 421, 422, 423) employed in the structure of FIG. 4B, a desired current-limiting resistance R2 develops integrally within the first contact structure CS1 between drains D1 and D2.

In addition, a parasitic first diode 405 develops integrally within the first contact structure CS1 between current-limiting resistance R2 and drains D1 and D5. (Drains D1 and D5 are formed of a common N+ region 403, part of which is shown in FIG. 4B.) A leaky, parasitic second diode 408 also develops integrally within the first contact structure CS1 between lower gate electrodes G4b, G3 and upper gate electrode G4a.

In similar fashion, a second contact structure CS2 is provided within second inverter 402 for coupling drain D3 of sink transistor N3 to drain D4 of load transistor P4 and for further coupling drain electrodes D3 and D4 to gate electrodes G1, G2a and G2b of first inverter 401. Second contact structure CS2 is a self-aligned multi-level interconnect structure in accordance with the invention. A side cross sectional view of second contact structure CS2 is not shown in FIG. 4B but understood to be similar to that of the illustrated first contact structure CS1.

Due to the conductivity types (P or N) and doping concentrations of the multiple conductive layers (412, 421, 422, 423) employed in the structure of FIG. 4B, a desired current-limiting resistance R4 develops integrally within the second contact structure CS2 between drains D3 and D4. A parasitic third diode 406 also develops integrally within the second contact structure CS2 between current-limiting resistance R4 and drains D3 and D6. (Drains D3 and D6 are formed of a common N+ region 404, not shown in FIG. 4B.) Moreover, a leaky, parasitic fourth diode 407 develops integrally within the second contact structure CS2 between lower gate electrodes G2b, G1 and upper gate electrode G2a.

The operation of SRAM cell 400 is explained briefly as follows. Transistor P2 becomes conductive when the voltage of its respective upper and lower gates, G2a and G2b are dropped to a level substantially below the $V_{cc}$ voltage at its source electrode S2. Transistor N1 becomes conductive when the voltage at its gate electrode G1 is raised substantially above the voltage at its source electrode S1.

Assume that N1 is turned on (a conductive channel is formed between its source and drain) and P2 is turned off (it is nonconductive). Sink transistor N1 then discharges upper gate electrode G4a by way of a discharge path including first contact structure CS1 and diode 405. This biases the voltage of gate G4a close to ground. Transistor P4 is therefore turned on and it charges the second contact structure CS2 to a voltage of approximately $+V_{cc}$. Gate electrodes G4b and G3 discharge to a voltage close to ground by way of leaky diode 408, contact structure CS1, diode 405 and sink transistor N1. Sink transistor N3 is therefore turned off (nonconductive). The approximately $+V_{cc}$ voltage on second contact structure CS2 charges the respective upper and lower gate electrodes, G2a and G2b, of load transistor P2, thereby turning load transistor P2 off and minimizing current flow through P2 from the $+V_{cc}$ power rail to ground.

SRAM cell 400 is considered to be in the "reset" state when N1 and P4 are turned on (conductive) while N3 and P2 are turned off (non conductive).

To set SRAM cell 400, a logic-high voltage (substantially above ground) is applied to bit line BL and a logic-low voltage (substantially below $+V_{cc}$) is applied to complementary bit line BL*. Word line WL is raised high thereby turning on pass-transistors N5 and N6. The low voltage on complementary bit line BL*, discharges upper gate G2a by way of second contact structure CS2, diode 406 and turned-on transistor N6. Lower gate electrode G2b and gate electrode G1 are discharged through leaky diode 407. As the voltage on G2a drops, load transistor P2 turns on to charge upper gate G4a to approximately +$V_{cc}$ by way of current-limiting resistance R2 and the remainder of first contact structure CS1. Gates G4b and G3 charge high by way of the leaky forward-biased diode 408.

Power consumption of SRAM cell 400 during state switching can be controlled by appropriate setting of the resistances of elements R2 and R4. In most instances, the circuitry of second inverter 402 is made identical to that of first inverter 401.

Referring to FIG. 4B, one major aspect of the illustrated SRAM design is minimization of the lateral distance "d" consumed by contact structures CS1 and CS2. Previous, conventional structures consumed two or more times as much space. (Conventional multi-layer contacts are staggered vertically and horizontally in stair-case fashion.)

FIG. 4B shows a side cross-section of sink transistor N1 (composed of source, gate and drain elements, S1, G1 and D1) and also a cross section of load transistor P2 (composed of source, gate and drain elements, S2, G2a, G2b and D2). Although not shown, it is to be understood that a similar, but laterally reversed, cross-section is provided for implementing transistors N3 and P4. TFT transistor P4 is to be visualized as lying in a plane below that of FIG. 4B, and behind the upper portion of first contact structure CS1. The upper layer of contact structure CS1 extends continuously to the not-shown lower plane to form upper gate electrode G4a of transistor P4.

Similarly, transistor N3 is to be visualized as being positioned in the underlying plane behind the lower portion of first contact structure CS1. The two poly-1 layer sections labeled as "(G3, G4b)" are to be visualized as extending continuously into the underlying plane to form the lower gate G4b of transistor P4 and the gate G3 of transistor N3.

Moreover, the second contact structure CS2 is to be visualized as being positioned in the underlying plane behind illustrated transistors P2 and N1. Illustrated gate portion G2a is to be visualized as extending continuously to the upper part of not-shown contact structure CS2. The illustrated dual-gates section "G2b,G1" is also to be visualized as extending continuously to make contact with the underlying second contact structure CS2.

A bulk substrate portion 410 of the structure shown in FIG. 4B constitutes moderately-doped P type monocrystalline silicon. Heavily-doped, double-diffused, N+ regions 409 and 403 are formed within substrate 410 to define the S1 and D1 portions of sink transistor N1 as shown. Conventional implantation or diffusion methods are used.

A thick field oxide (Fox) region 411 separates N+ region 403 from the N+ region 412 of an adjacent SRAM cell. The contact structure of the adjacent SRAM cell is labeled "CSn".

A thin silicon dioxide insulating layer 431 is grown on top of substrate 410 to define the gate-oxide layer (GoX) 431 of sink transistors N1 and N3 (and also of the not-shown pass transistors N5 and N6).

A heavily doped N+ first polysilicon layer 421 is deposited on GoX layer 431. The poly-1 section labeled "G1" is patterned at this time. If desired, source and drain regions S1 and D1 can be implanted in self-aligned manner using the patterned G1 section as an implant mask. The separation between the poly-1 sections labeled as (G4b, G3) does not yet exist.

The top of the first polysilicon layer 421 is next oxidized to define second oxide layer 432.

Second polysilicon layer 422 is thereafter deposited on oxide layer 432 and moderately doped to have an N conductivity type. The through-hole for first contact structure CS1 is not yet formed at this time.

An upper portion of the poly-2 layer 422 is thereafter oxidized to form third insulating layer 433. Region 434 is fully oxidized so that it combines with field oxide (FOX) region 411 to isolate adjacent SRAM cells.

At this point, a passageway is formed from third insulator layer 433 down through first insulator layer 431 to the N+ regions 403 and 412 in accordance with the above-described multi-layer, self-aligned contact forming method. The above-described contact area enhancing methods are performed if desired and the third polysilicon layer 423 is thereafter deposited to create the illustrated contact structures CS1 and CSn.

The third polysilicon layer 423 is thereafter patterned as shown and heavily doped by implantation to have a P+ conductivity type. Source region S2 obtains a heavy to moderately doped profile P+/P as shown at the same time. Drain region D2 and drain-extension region R2 also attain a moderate P doping profile at this time.

The illustrated contact structure (CS1 or CSn) therefore provides the following connections. A P to P+ ohmic connection is formed between the poly-2 layer 422 and the poly-3 layer 423. A N+ to P+ leaky diode connection 408 is formed between the poly-1 layer 421 and the poly-3 layer 423 respectively. A N+ to P+ diode connection 405 is formed between monocrystalline region 412 and the poly-3 layer 423.

Many variations will become apparent to those skilled in the art. If desired, for example, the third polysilicon layer 423 could have been replaced with a conductive aluminum or other metal layer. Alternatively, the third polysilicon layer 423 could have been heavily doped as N+ instead of P+. This however, would change the working function between upper gate G2a of the thin film transistor P2 and the underlying, moderately-doped N channel region of transistor P2. Adjustments would have to be made in the design of TFT transistor P2 and in the cell fabrication process in order to compensate for the difference in working function.

The above disclosure is to be taken as illustrative of the invention, not as limiting its scope or spirit. Numerous other modifications and variations will become apparent to those skilled in the art after studying the above disclosure. By way of example, the multi-layer contact structure can be applied in the construction of DRAM cells rather than SRAM cells. It is of course, applicable to many other electronic integrated circuits in which multi-layer connections are desired.

Given the above disclosure of general concepts and specific embodiments, the scope of protection sought is to be defined by the claims appended hereto.

What is claimed is:

1. A fabricating method for fabricating in an integrated circuit having a substrate, an interconnect network that interconnects plural devices of the integrated circuit, said method comprising the steps of:

forming a first plurality of spaced-apart insulative layers on said substrate, said first plurality including a top insulative layer;

forming a second plurality of spaced-apart conductors and positioning them interdigitally relative to said insulative layers, said conductors being below the top insulative layer;

defining a first hole extending through the top insulative layer;

using the first hole for defining a succession of self-aligned subsequent holes through at least two of the underlying plural conductors and at least one underlying insulative layer, each successive hole being continuous with and self-aligned to one above it;

defining a through-conductor extending through said first hole and said succession of self-aligned subsequent holes and electrically coupling to at least one of said at least two spaced-apart conductors; and performing a contact-area enhancing step after said step of using the first hole to define a succession of self-aligned subsequent holes but before said step of defining a through-conductor;

wherein the contact-area enhancing step includes widening one or more of the first hole and insulator-piercing ones of the succession of self-aligned subsequent holes so as to increase an exposed surface area of a corresponding one or more of said second plurality of spaced-apart conductors, the exposed surface area being that exposed by said first hole and succession of self-aligned subsequent holes.

2. A fabricating method according to claim 1 further comprising the steps of:

depositing a resist layer on the top insulative layer prior to the step of defining said first hole through the top insulative layer;

defining a reference hole extending through the resist layer; and using the reference hole to define said first hole and thereafter said succession of self-aligned subsequent holes through the underlying conductors and insulative layers.

3. A fabricating method according to claim 2 wherein the substrate has a contract region defined thereon, and said step of defining a reference hole includes:

aligning said reference hole over the contact region; and thereafter defining said succession of self-aligned subsequent holes through the underlying conductors and insulative layers so as to expose the contact region.

4. A fabricating method according to claim 3 wherein said substrate includes semiconductor material.

5. A fabricating method according to claim 4 wherein said substrate includes a plurality of regions of different conductivities, said plurality of regions defining the plural devices of the integrated circuit, and wherein the contact region defines one such region.

6. A fabricating method according to claim 5 wherein said second plurality of spaced-apart conductors are composed of conductive semiconductors each selected from the group consisting of a P conductivity type semiconductor and a N conductivity type semiconductor.

7. A fabricating method according to claim 6 wherein said through-conductor is composed of a conductive semiconductor selected from the group consisting of a P conductivity type semiconductor and a N conductivity type semiconductor.

8. A fabric method according to claim 7 wherein said through-conductor is composed of polycrystalline silicon.

9. A fabricating method according to claim 8 wherein one or more of said second plurality of spaced-apart conductors is composed of polycrystalline silicon.

10. A fabricating method according to claim 2
wherein the first plurality of insulative layers and interdigitated second plurality of conductors are respectively composed of etch-differentiated materials such that one can be differentially etched without substantial etching into a directly underlying other;

wherein said step for defining a succession of self-aligned subsequent holes includes:
using a layer-specific differential etchant for respectively and differentially etching through each of the first plurality of insulative layers below the top insulative layer and through each of the interdigitated second plurality of conductors to thereby respectively define the self-aligned subsequent holes; and wherein said step of depositing a resist layer includes:
selecting the thickness and material of the resist layer such that the resist layer can survive the subsequent, combined series of hole-defining steps that define the first hole and the succession of self-aligned subsequent holes.

11. A fabricating method according to claim 3 wherein the step of defining the through-conductor includes extending it to contact said contact region.

12. A fabricating method according to claim 11 wherein the through-conductor and contact region are each composed of doped semiconductor material and are each doped to have a same conductivity type.

13. A fabricating method according to claim 11 wherein the through-conductor is composed of N or P doped polysilicon.

14. A fabricating method according to claim 7 wherein the conductivity type of said through-conductor is the same as that of at least two of said spaced-apart conductors.

15. A fabricating method according to claim 14 wherein the through-conductor provides an ohmic connection path between the at least two of said spaced-apart conductors of same conductivity type.

16. A fabricating method according to claim 14 wherein one of said spaced-apart conductors with a same conductivity type as said through-conductor is doped substantially more lightly than the through-conductor to thereby define an integrated resistive element within the fabricated interconnect network.

17. A fabricating method according to claim 14 wherein one of said spaced-apart conductors with a same conductivity type as said through-conductor is doped substantially more lightly than a second of said spaced-apart conductors to thereby define an integrated resistive element within the fabricated interconnect network.

18. A fabricating method according to claim 7 wherein the conductivity type of said through-conductor is set different from that of at least one of said spaced-apart conductors to thereby define an integrated PN junction within the fabricated interconnect network.

19. A fabricating method according to claim 1 wherein said substrate has a contact region of one of said plural devices defined on an upper surface of the substrate;

wherein the steps of forming said interdigitated insulative and conductive layers place the lowermost of the insulative layers on the substrate, overlying the contact region;

wherein said step of defining the first hole includes aligning said first hole over the contact region; and wherein said steps of thereafter defining said succession of self-aligned subsequent holes through the underlying conductors and insulative layers exposes the contact region.

20. A fabricating method according to claim 1 wherein the second plurality of spaced-apart conductors includes three or more conductors and said step for defining the succession of self-aligned subsequent holes cuts through at least three of the underlying plural conductors.

21. A fabricating method according to claim 1 wherein the conductors of said second plurality of spaced-apart conductors are composed of a conductive semiconductor material.

22. A fabricating method according to claim 21 wherein the conductors of said second plurality of spaced-apart conductors are composed of conductive polycrystalline silicon.

23. A fabricating method according to claim 1
wherein the first plurality of insulative layers and interdigitated second plurality of conductors are respectively composed of etch-differentiated materials such that one can be differentially etched without substantial etching into a directly underlying other; and wherein said step for defining a succession of self-aligned subsequent holes includes:

using a layer-specific differential etchant for respectively and differentially etching through each of the first plurality of insulative layers below the top insulative layer and through each of the interdigitated second plurality of conductors to thereby respectively define the self-aligned subsequent holes.

24. A fabricating method according to claim 23 wherein said first plurality of insulative layers each consists essentially of one or more silicon oxide compounds and the differential etchant used for differentially etching through each of the first plurality of insulative layers below the top insulative layer is selected from the oxide-specific etchant group consisting of: $CF_4$, $C_2F_6$, $CHF_3$ and $SF_6$.

25. A fabricating method according to claim 24 wherein said second plurality of conductors each consists essentially of silicon and the differential etchant used for differentially etching through each of the second plurality of conductors is selected from the silicon-specific etchant group consisting of: $Cl_2$ and $CFCl_3$.

26. A fabricating method according to claim 23
wherein the etch-differentiated materials of the first plurality of insulative layers are selected from the group consisting of silicon oxides, silicon nitrides, and silicon oxy-nitrides ($Si_xO_yN_z$); and wherein the corresponding etch-differentiated materials of the second plurality of conductors are selected from the group consisting of: doped silicon, aluminum, copper, tungsten, titanium and cobalt.

27. A fabricating method according to claim 23 wherein the etch-differentiated nature of the first plurality of insulative layers and interdigitated second plurality of conductors is used to stop the depth of the succession of self-aligned subsequent holes at any desired layer above the substrate.

28. A fabricating method according to claim 23 wherein said step for differentially defining the succession of self-aligned subsequent holes is performed by anisotropic plasma etching.

29. A fabricating method according to claim 1
wherein the step of defining the through-conductor includes electrically coupling the through-conductor to at least two of said spaced-apart conductors; and wherein one of the coupled-to spaced-apart conductors defines the gate electrode of a field effect transistor.

30. A fabricating method according to claim 29 wherein another of the coupled-to spaced-apart conductors defines the source, channel and drain of a thin-film field effect transistor.

31. A fabricating method for fabricating an interconnect structure that interconnects plural devices, said method comprising the steps of:

forming a first plurality of spaced-apart insulative layers, said first plurality including a top insulative layer;

forming a second plurality of spaced-apart conductors and positioning them interdigitally relative to said insulative layers;

defining a first hole extending through the top insulative layer;

using the first hole for defining a succession of self-aligned subsequent holes through the underlying conductors and insulative layers, each successive hole being continuous with and self-aligned to one above it; and defining a through-conductor extending through said succession of self-aligned holes and contacting at least two of said spaced-apart conductors;

wherein said steps of defining the first hole and succession of self-aligned subsequent holes respectively include use of an anisotropic etch process that is selective to the material through which the respective one of the first hole and succession of self-aligned subsequent holes is being defined; and before said step of defining the through-conductor, selectively and isotropically removing some of the insulative material exposed by said succession of self-aligned holes, to thereby increase the surface area of at least one of the conductors exposed by said succession of self-aligned holes and subsequently contacted by the through-conductor.

32. A fabricating method according to claim 31 wherein said step for increasing the surface area of at least one of the conductors increases exposure of one or both of top and bottom surface portions of the at least one conductor.

33. An interconnect fabricating method comprising the steps of:

forming a first plurality of spaced-apart insulative layers, said first plurality including a top insulative layer;

forming a second plurality of spaced-apart conductors and positioning them interdigitally relative to said insulative layers;

defining a first hole extending through the top insulative layer;

using the first hole for defining a succession of self-aligned subsequent holes through the underlying conductors and insulative layers, each successive hole being continuous with and self-aligned to one above it;

increasing the effective contactable surface area of at least one of the conductors exposed by said succession of self-aligned holes for thereby increasing effective contact area between the at least one conductor and a subsequently-formed through-conductor; and defining said through-conductor extending through said succession of self-aligned holes and contacting the at least one conductor whose effective contact surface area has been increased;

wherein the step of increasing the effective contact surface area of the at least one conductor includes one or more of the following substeps;

(a) selectively removing some of the insulative material exposed by said succession of self-aligned holes, to thereby increase the surface area of the at least one conductor exposed by said succession of self-aligned holes;

(b) selectively removing spaced apart spots on the surface area of the at least one conductor exposed by said succession of self-aligned holes to thereby leave pits in said surface area of the at least one conductor; and (c) selectively growing additional conductive material from the surface area of the at least one conductor exposed by said succession of self-aligned holes to thereby create bumps in said surface area of the at least one conductor.

34. A fabricating method according to claim 33 wherein said step for increasing the surface area of the at least one conductor increases exposure of one or both of top and bottom surface portions of the at least one conductor.

35. A fabricating method for fabricating in an integrated circuit having a substrate, an interconnect network that interconnects plural devices of the integrated circuit, said method comprising the steps of:

forming a first plurality of spaced-apart insulative layers on said substrate, said first plurality including a top insulative layer;

forming a second plurality of spaced-apart conductors and positioning them interdigitally relative to said insulative layers, said conductors being below the top insulative layer;

defining a first hole extending through the top insulative layer;

using the first hole for defining a succession of self-aligned subsequent holes through at least two of the underlying plural conductors and at least one underlying insulative layer, each successive hole being continuous with and self-aligned to one above it;

defining a through-conductor extending through said first hole and said succession of self-aligned subsequent holes and electrically coupling to at least one of said at least two spaced-apart conductors;

depositing a resist layer on the top insulative layer prior to the step of defining said first hole through the top insulative layer;

defining a reference hole extending through the resist layer;

using the reference hole to define said first hole and thereafter said succession of self-aligned subsequent holes through the underlying conductors and insulative layers;

wherein the substrate has a contact region defined thereon, and said step of defining a reference hole includes:

aligning said reference hole over the contact region; and thereafter defining said succession of self-aligned subsequent holes through the underlying conductors and insulative layers so as to expose the contact region;

wherein said substrate includes semiconductor material having a plurality of regions of different conductivities, said plurality of regions defining the plural devices of the integrated circuit, and wherein the contact region defines one such region;

wherein said second plurality of spaced-apart conductors are composed of conductive semiconductors each having a conductivity selected from the group consisting of P and N;

wherein said through-conductor is composed of a conductive semiconductor having a conductivity selected from the group consisting of P and N;

wherein the conductivity type of said through-conductor is the same as that of at least two of said spaced-apart conductors; and wherein one of said spaced-apart conductors with a same conductivity type as said through-conductor is doped substantially more lightly than the through-conductor to thereby define an integrated resistive element within the fabricated interconnect network.

36. A fabricating method for fabricating in an integrated circuit having a substrate, an interconnect network that interconnects plural devices of the integrated circuit, said method comprising the steps of:

forming a first plurality of spaced-apart insulative layers on said substrate, said first plurality including a top insulative layer;

forming a second plurality of spaced-apart conductors and positioning them interdigitally relative to said insulative layers, said conductors being below the top insulative layer;

defining a first hole extending through the top insulative layer;

using the first hole for defining a succession of self-aligned subsequent holes through at least two of the underlying plural conductors and at least one underlying insulative layer, each successive hole being continuous with and self-aligned to one above it;

defining a through-conductor extending through said first hole and said succession of self-aligned subsequent holes and electrically coupling to at least one of said at least two spaced-apart conductors;

depositing a resist layer on the top insulative layer prior to the step of defining said first hole through the top insulative layer;

defining a reference hole extending through the resist layer;

using the reference hole to define said first hole and thereafter said succession of self-aligned subsequent holes through the underlying conductors and insulative layers;

wherein the substrate has a contact region defined thereon, and said step of defining a reference hole includes:

aligning said reference hole over the contact region; and thereafter defining said succession of self-aligned subsequent holes through the underlying conductors and insulative layers so as to expose the contact region;

wherein said substrate includes semiconductor material having a plurality of regions of different conductivities, said plurality of regions defining the plural devices of the integrated circuit, and wherein the contact region defines one such region;

wherein said second plurality of spaced-apart conductors are composed of conductive semiconductors each having a conductivity selected from the group consisting of P and N;

wherein said through-conductor is composed of a conductive semiconductor having a conductivity selected from the group consisting of P and N; and wherein the conductivity type of said through-conductor is set different from that of at least one of said spaced-apart conductors to thereby define an integrated PN junction within the fabricated interconnect network.

37. A fabricating method for fabricating in an integrated circuit having a substrate, an interconnect network that interconnects plural devices of the integrated circuit, said method comprising the steps of:

forming a first plurality of spaced-apart insulative layers on said substrate, said first plurality including a top insulative layer;

forming a second plurality of spaced-apart conductors and positioning them interdigitally relative to said insulative layers, said conductors being below the top insulative layer;

defining a first hole extending through the top insulative layer;

using the first hole for defining a succession of self-aligned subsequent holes through at least two of the underlying plural conductors and at least one underlying insulative layer, each successive hole being continuous with and self-aligned to one above it; and defining a through-conductor extending through said first hole and said succession of self-aligned subsequent holes and electrically coupling to at least one of said at least two spaced-apart conductors;

wherein the step of defining the through-conductor includes electrically coupling the through-conductor to at least two of said spaced-apart conductors; and wherein one of the coupled-to spaced-apart conductors defines the gate electrode of a field effect transistor.

38. A fabricating method according to claim 37 wherein another of the coupled-to spaced-apart conductors defines the source, channel and drain of a thin-film field effect transistor.

39. An interconnect fabricating method comprising the steps of:

forming a first plurality of spaced-apart insulative layers, said first plurality including a top insulative layer;

forming a second plurality of spaced-apart conductors and positioning them interdigitally relative to said insulative layers;

defining a first hole extending through the top insulative layer;

using the first hole for defining a succession of self-aligned subsequent holes through the underlying conductors and insulative layers, each successive hole being continuous with and self-aligned to one above it;

increasing the effective contactable surface area of at least one of the conductors exposed by said succession of self-aligned holes for thereby increasing effective contact area between the at least one conductor and a subsequently-formed through-conductor; and defining said through-conductor extending through said succession of self-aligned holes and contacting the at least one conductor whose effective contact surface area has been increased;

wherein said step for increasing the surface area of the at least one conductor increases exposure of one or both of top and bottom surface portions of the at least one conductor.

* * * * *

UNITED STATES PATENT AND TRADEMARK OFFICE
CERTIFICATE OF CORRECTION

PATENT NO. : 5,439,848

DATED : August 8, 1995

INVENTOR(S) : Sheng T. Hsu et al.

It is certified that error appears in the above-identified patent and that said Letters Patent is hereby corrected as shown below:

Column 7, line 44, "$Si_xO\ N_z$" should be --$Si_xO_yN_z$--.
Column 15, line 43, "contract" should be --contact--.
Column 16, line 1, "fabric" should be --fabricating--.

Signed and Sealed this

Nineteenth Day of December, 1995

*Attest:*

BRUCE LEHMAN

*Attesting Officer*     *Commissioner of Patents and Trademarks*